United States Patent [19]

Itoh

[11] Patent Number: 5,030,927
[45] Date of Patent: Jul. 9, 1991

[54] REACTANCE CONTROL CIRCUIT WITH A DC AMPLIFIER FOR MINIMIZING A VARIATION OF A REFERENCE REACTANCE VALUE

[75] Inventor: Masashi Itoh, Yokohama, Japan

[73] Assignee: Kabushiki Kaisha Toshiba, Kawasaki, Japan

[21] Appl. No.: 492,481

[22] Filed: Mar. 12, 1990

[30] Foreign Application Priority Data

Mar. 20, 1989 [JP] Japan .................................. 1-65861

[51] Int. Cl.$^5$ .......................... H03B 5/32; H03L 7/00
[52] U.S. Cl. ............................ 331/116 R; 331/177 R; 333/214
[58] Field of Search ............. 331/36 R, 116 R, 177 R; 333/214; 334/14, 15

[56] References Cited

U.S. PATENT DOCUMENTS 4,581,593 4/1986 Okanobu ......................... 331/116 R
4,745,375 5/1988 Suzuki ............................. 331/116 R Primary Examiner—Siegfried H. Grimm
Attorney, Agent, or Firm—Banner, Birch, McKie & Beckett

[57] ABSTRACT

A reactance control circuit comprising a variable reactance circuit whose reactance is determined by the currents flowing to first and second differential transistor circuits, a differential amplifier for producing first and second currents in accordance with an input voltage, and a DC amplifier circuit for amplifying the first and second currents and supplying the amplified currents to the variable reactance circuit in order to control the currents flowing to the first and second differential transistor circuits. The DC amplifier circuit includes first and second transistors for supplying output currents to the variable reactance circuit, and a base potential control circuit for, when the first and second currents are equal to each other, supplying a predetermined low potential to the bases of the first and second transistors so that the currents flowing to the first and second transistors are both reduced.

18 Claims, 4 Drawing Sheets

REACTANCE CONTROL CIRCUIT WITH A DC AMPLIFIER FOR MINIMIZING A VARIATION OF A REFERENCE REACTANCE VALUE

BACKGROUND OF THE INVENTION

1. Field of the Invention

The present invention relates to a reactance control circuit, and more particularly to a reactance control circuit for use in a variable frequency oscillator.

2. Description of the Related Art

An example of a typical conventional variable frequency oscillator is shown in FIG. 1, and comprises a differential amplifier 2, a DC amplifier 3, a variable reactance circuit 4, and an oscillator 5. The oscillating frequency generated by the oscillator 5 is determined by an oscillating frequency of the oscillator 5 and the value of reactance of the reactance circuit 4. The reactance circuit 4 is made up of a capacitor C1, a resistor R5, and differential amplifiers 6 and 7, respectively coupled with the oscillator 5 in a negative feedback and a positive feedback fashion. Since the negative feedback loop has the effect of decreasing the output frequency of the oscillator 5, and the positive feedback loop increases the same, therefore the reactance value of the variable reactance circuit 4 can be varied in accordance with the ratio (I3/I4) of the value of a current I3 flowing through the differential transistor circuit 6 and that of a current I4 flowing through the differential transistor circuit 7. When the current I3 is greater than the current I4, the output frequency of the oscillator 5 is decreased by the negative feedback loop of the differential transistor circuit 6, with the result that the reactance value C of the variable reactance circuit 4 increases. When on the other hand, the current I3 is less than the current I4, the output frequency of the oscillator 5 is increased by the positive feedback loop of the differential transistor circuit 7, and thus the reactance value C of circuit 4 decreases.

The current ratio I3/I4 is determined by the differential amplifier 2 and the DC amplifier 3. In the differential amplifier 2, currents I1 and I2 are determined by the difference in the level of an input voltage Vin and a reference voltage Vref1, are amplified by the DC amplifier 3, and supplied in the form of currents I3 and I4 to the differential transistor circuits 6 and 7.

When there is zero difference in the level of the input voltage Vin and the reference voltage Vref1, the currents I3 and I4 are then equal, in which case the negative feedback operation by the differential transistor circuit 6 and the positive feedback operation by the differential transistor circuit 7 cancel each other out. Therefore, the reactance value of the variable reactance circuit 4 is determined solely by capacitor C1 and the oscillator 5, independent of the currents I3 and I4, and the reactance value is equal to a reference reactance Cref. When the reactance value is equal to the reference reactance Cref, the variable frequency oscillator generates an output signal Vout of a free running frequency Fref.

The DC amplifier 3 of the variable frequency oscillator shown in FIG. 1 uses NPN transistors Q1 and Q2. However, the geometrics and operating characteristics of such transistors are frequently nonuniform, this being attributable to the process used to manufacture them. Thus, when there is zero difference in the level of the input voltage Vin and the reference voltage Vref1, and hence the current I1 is equal to the current I2, the reactance value C of the reactance circuit 4 may not be equal to the reference reactance Cref, for the reason that even if the currents I1 and I2 applied to the bases of the transistors Q1 and Q2 are equal to each other, the currents I3 and I4 passing through the transistors Q1 and Q2 may not be equal if the operating characteristics and geometrics of these transistors differ from each other. Consequently, if the reactance value C of the variable reactance circuit 4 is not equal to the reference reactance value Cref, the free running frequency Fref of the variable frequency oscillator will differ from its designed value.

SUMMARY OF THE INVENTION

Accordingly, an object of the present invention is to provide a reactance control circuit which provides a desired reference reactance value Cref even if the transistors of the DC amplifier thereof have different geometrics and operating characteristics.

To achieve the above object, there is provided a reactance control circuit comprising: a variable reactance circuit having first and second differential transistor circuits, the reactance of the variable reactance circuit being determined by the currents flowing to the first and second differential transistors; a differential amplifier for producing first and second currents in accordance with an input voltage; and a DC amplifier circuit for amplifying the first and second currents derived from the differential amplifier, and for supplying the amplified currents to the variable reactance circuit in order to control the currents flowing to the first and second differential transistor circuits. The DC amplifier circuit includes first and second input terminals for receiving first and second currents output from the differential amplifier circuit, first and second output terminals for supplying third and fourth currents to the variable reactance circuit, a first transistor, having a collector coupled with the first output terminal, an emitter coupled with a predetermined potential supplying terminal, and a base, a second transistor, having a collector coupled with the second output terminal, an emitter coupled with the predetermined potential supplying terminal, and a base, and base potential control means. When the first and second currents differ from each other, the base potential control means supplies different potentials to the bases of the first and second transistors so that third and fourth currents corresponding to the first and second currents flow through the first and second transistors, respectively. When the first and second currents are equal to each other, the base potential control means supplies a predetermined low potential to the bases of the first and second transistors, so that the third and fourth currents flowing to the first and second transistors are both reduced.

Therefore, even if the first and the second transistors differ in their geometrics and operating characteristics, any difference in the third and fourth currents will be very small. As a result, the reference reactance of the variable reactance circuit of the present invention is unaffected by differences in geometrics and operating characteristics of the first and the second transistors; thus, in this invention, the desired reference reactance can be assured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 2:
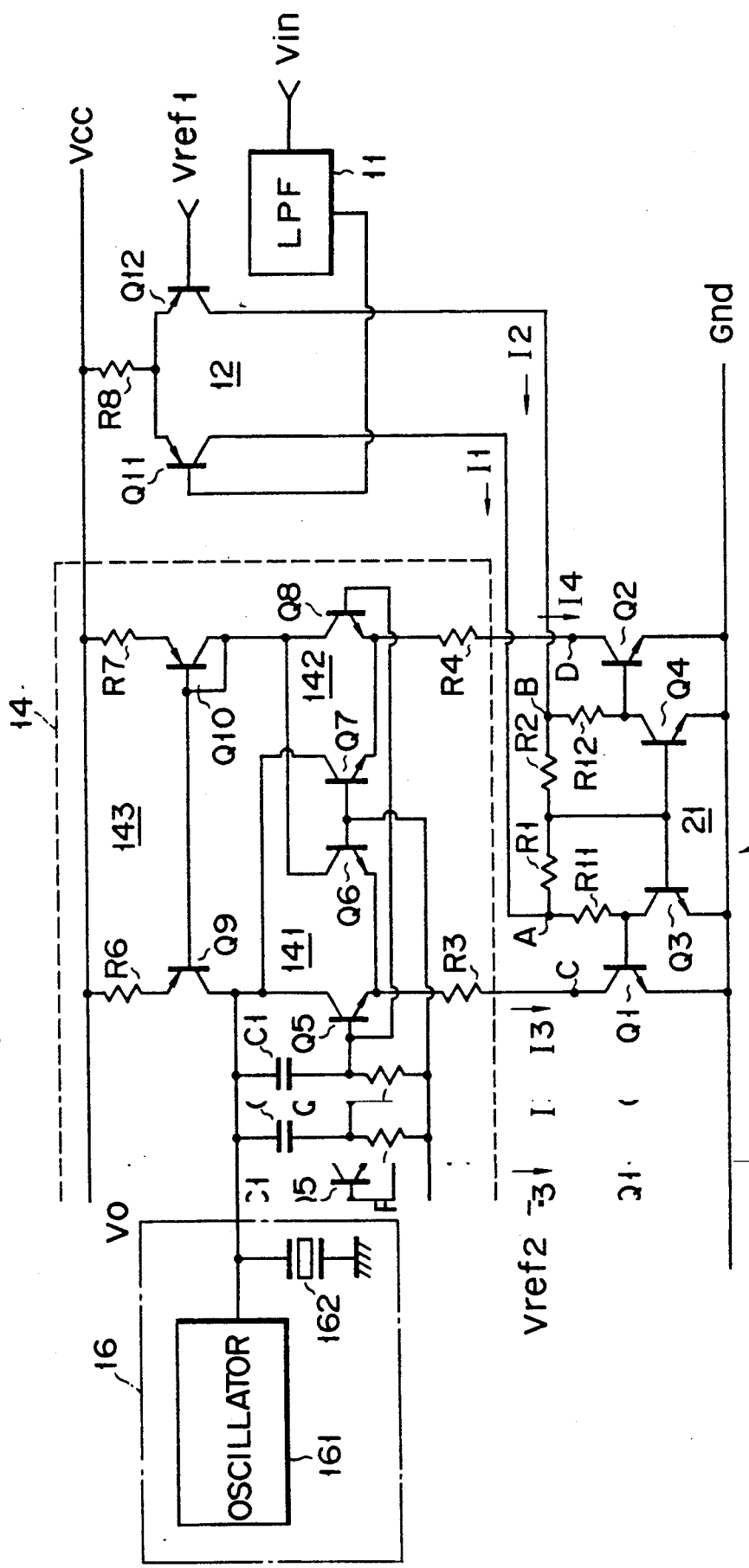
FIG. 2 is a circuit diagram showing a variable frequency oscillator using a reactance control circuit which is a first embodiment of the present invention.

A variable frequency oscillator using a reactance control circuit which is a first embodiment of the present invention will now be described with reference to FIG. 2.

The variable frequency oscillator according to this embodiment comprises a differential amplifier 12, a variable reactance circuit 14, an oscillating circuit 16, and a DC amplifier 20.

The differential amplifier 12 is made up of a resistor R8, PNP transistors Q11 and Q12, and a low-pass filter (LPF) 11. An input voltage Vin is smoothed by low-pass filter 11 and is supplied to the base of the PNP transistor Q11. The base of the PNP transistor Q12, on the other hand, is coupled for reception of a reference voltage Vref1. The value of a difference in the level of the input voltage Vin and the reference voltage Vref1 determines the levels of currents I1 and I2 produced by the differential amplifier 12. For example, when there is zero difference in these voltages, the currents I1 and I2 are equal.

The oscillating circuit 16 is made up of an oscillator 161 and a ceramic resonator 162, and its oscillating frequency is determined by the resonance frequency of the ceramic resonator 162 and the reactance value of the variable reactance circuit 14.

The variable reactance circuit 14 is made up of a capacitor C1, resistors R3 to R5, a first differential transistor circuit 141 including NPN transistors Q5 and Q6, a second differential transistor circuit 142 including NPN transistors Q7 and Q8, and a current mirror circuit 143 including PNP transistors Q9 and Q10 and resistors R6 and R7. The common emitter connection of the NPN transistors Q5 and Q6 in the first differential transistor circuit 141, is connected to a current output terminal C of the DC amplifier 20, by way of the resistor R3, and the emitters of transistors Q7 and Q8 in the differential transistor circuit 142 are connected, by way of the resistor R4, to a current output terminal D of the DC amplifier 20. The current mirror circuit 143 serves as a load circuit of the first and second differential transistor circuits 141 and 142 and is connected to these circuits.

The bases of the transistors Q6 and Q7 receive a reference voltage Vref2, and the bases of the transistors Q5 and Q8 are coupled for reception of a potential at the series connecting node of the capacitor C1 and the resistor R5. The differential transistor circuits 141 and 142 are coupled with the oscillator 16 in a negative feedback and a positive feedback fashion, respectively. The negative feedback loop decreases the output frequency of the oscillator 16, whereas the positive feedback loop increases the same.

In the circuit arranged thus, the reactance of the variable reactance circuit 14 is varied in accordance with the ratio (I3/I4) of a current I3 flowing through the differential transistor circuit 141 and a current I4 flowing through the differential transistor circuit 142. More specifically, when I3>I4, the negative feedback loop decreases the output frequency of the oscillator 16, with the result that the reactance C of the variable reactance circuit 14 is high. Conversely, when I3<I4, the positive feedback loop increases the output frequency of the oscillator 16, and thus the reactance C is low.

For simplicity, let us suppose two extreme cases. In the first case, the DC amplifier 20 generates the current I3 but not the current I4. In contrast, in the second case, the DC amplifier 20 generates the current I4 but not the current I3. In the first case, the reactance C of the variable reactance circuit 14, when viewed from the ceramic resonator 162, is expressed as $$C=(1+gm\cdot R5)C1 \qquad (1)$$

In the second case, the reactance C of the variable reactance circuit 14 is expressed as $$C=(1-gm\cdot R5)C1 \qquad (2)$$

In the above equations, gm denotes the mutual conductance of each of the transistors Q5 to Q8.

It is apparent from the above explanation that the reactance C of the variable reactance circuit 14 (parallel capacitance of the ceramic resonator 162) is controlled by the ratio (I3/I4) of the currents I3 and I4, and determines the oscillating frequency of the oscillating circuit 16.

The DC amplifier 20 functions to amplify the output currents I1 and I2 of the differential amplifier 12, and to feed the amplified currents as the currents I3 and I4 to the variable reactance circuit 14. The DC amplifier 20 is made up of NPN transistors Q1 and Q2 for producing the currents I3 and I4, and a control circuit 21 for providing base potentials for transistors Q1 and Q2. The control circuit 21 is made up of NPN transistors Q3 and Q4, and resistors R1, R2, R11, and R12.

The collector of transistor Q1 is connected to the current output terminal C for outputting the current I3, and the emitter of transistor Q1 is connected to a ground terminal. The collector of the transistor Q2 is connected to the current output terminal D for outputting the current, I4, and the emitter of transistor Q2 is connected to a ground terminal. The transistors Q1 and Q2 are designed to have the same geometrics, the base of the transistor Q1 being connected to the collector of the transistor Q3, whose emitter is connected to a ground terminal, and the base of the transistor Q2 being connected to the collector of the transistor Q4, whose emitter is also connected to a ground terminal. The bases of the transistors Q3 and Q4 are interconnected.

The resistor R11 is located between the input node A for receiving the current I1 from the differential amplifier 12 and the collector of the transistor Q3, and the resistor R12 is located between the input node B for receiving the current I2 from the amplifier 12 and the collector of the transistor Q4. The resistors R1 and R2 are located between the input nodes A and B, respectively, and the common base connection of transistors Q3 and Q4. The resistors R1 and R2 are equal in resistance, as are resistors R3 and R4.

When I1=I2 in the DC amplifier 20, the potential at a connection point (node A) of the resistors R1 and R11 is substantially equal to that at a connection point (node B) of the resistors R2 and R12. As a result, only a small amount of current flows between the nodes A and B through the resistors R1 and R2, and thus the current I1 flows into the resistor R11, while the current I2 flows into the resistor R12. Assuming that the resistance value of each of the resistors R11 and R12 is R, and the current value of each of the currents I1 and I2 is I, then the base potential of each transistor (Q1 or Q2) is smaller, by RI, than the potential at the corresponding node (A or B). Since the current flowing between the nodes A and B through the resistors R1 and R2 is almost zero, a potential at the base common to the transistors Q3 and Q4 is substantially equal to the potential at the node A(=node B).

Under this condition, the base-emitter voltage VBE1 of each of the transistors Q1 and Q2 is smaller by RI than that VBE2 of each of the transistors Q3 and Q4. Assuming that a current value of each current I3 and I4 is Iout, and a thermoelectromotive force of each transistor Q1 to Q4 is VT=KT/q (where K=Boltzman constant, T=absolute temperature, q=electric charge of an electron), a current gain Iout/I of the DC amplifier 20 when I1=I2, is expressed by $$Iout/I = EXP[-RI/VT] \qquad (3)$$

The above formula teaches that as the current I from the differential amplifier 12 increases, the current gain Iout/I of the DC amplifier 2 exponentially decreases. Therefore, when I1=I2, the output currents I3 and I4 of the DC amplifier 20 are both decreased to be extremely small.

Where the currents I3 and I4 are both small, the currents flowing into the transistors Q5 to Q8 in the variable reactance circuit 14 are small. Accordingly, the mutual conductance "gm" of each transistor Q5 to Q8 is also small. This fact implies that the term "gm×R5" in each of the equations (1) and (2) is small, and hence that even if the currents I3 and I4 are somewhat different, the reactance of the variable reactance circuit 14 is little changed by such a difference, and is kept at a value approximately equal to the reference reactance Cref.

Figure 1:
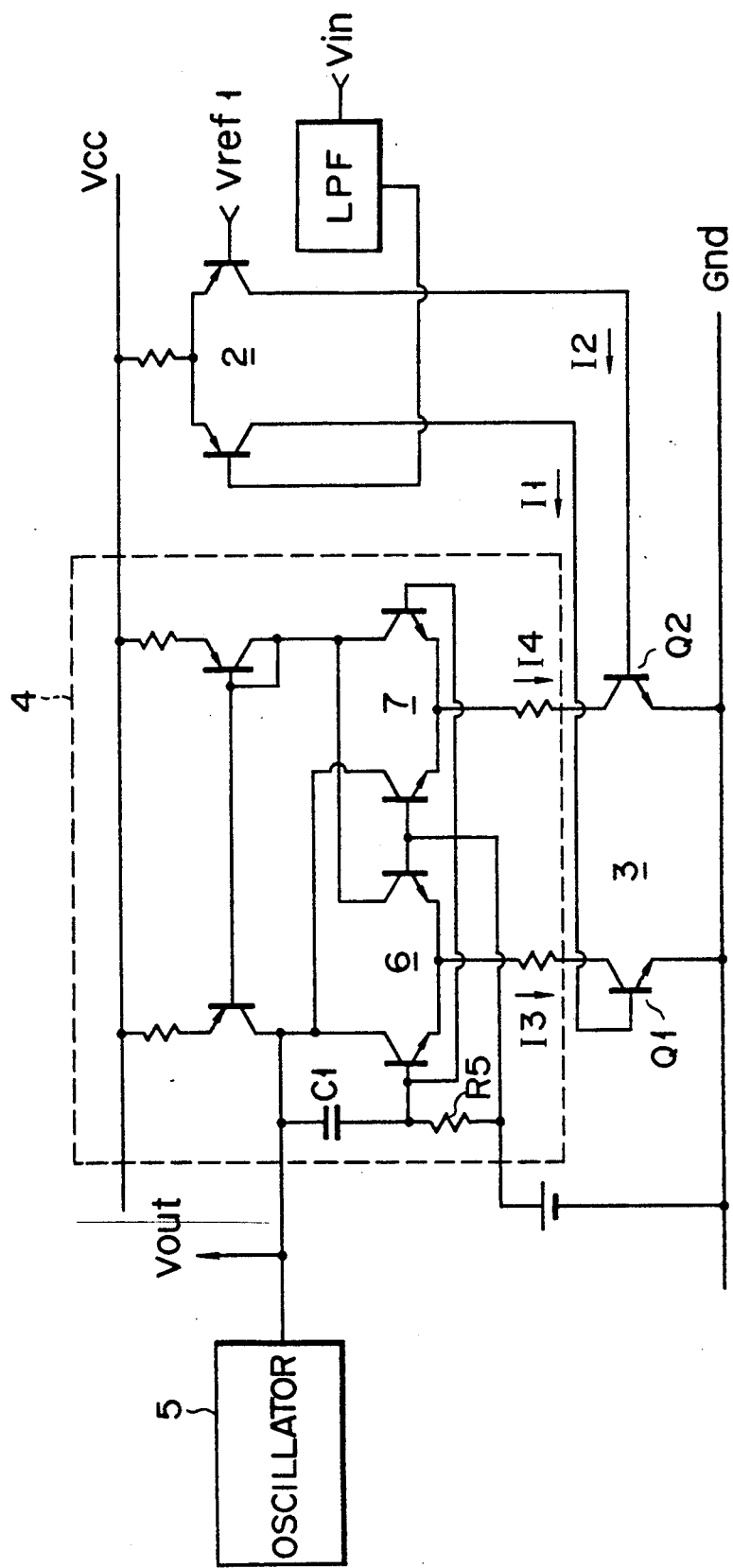
FIG. 1 is a circuit diagram showing a variable frequency oscillator using a conventional reactance control circuit.
Figure 3:
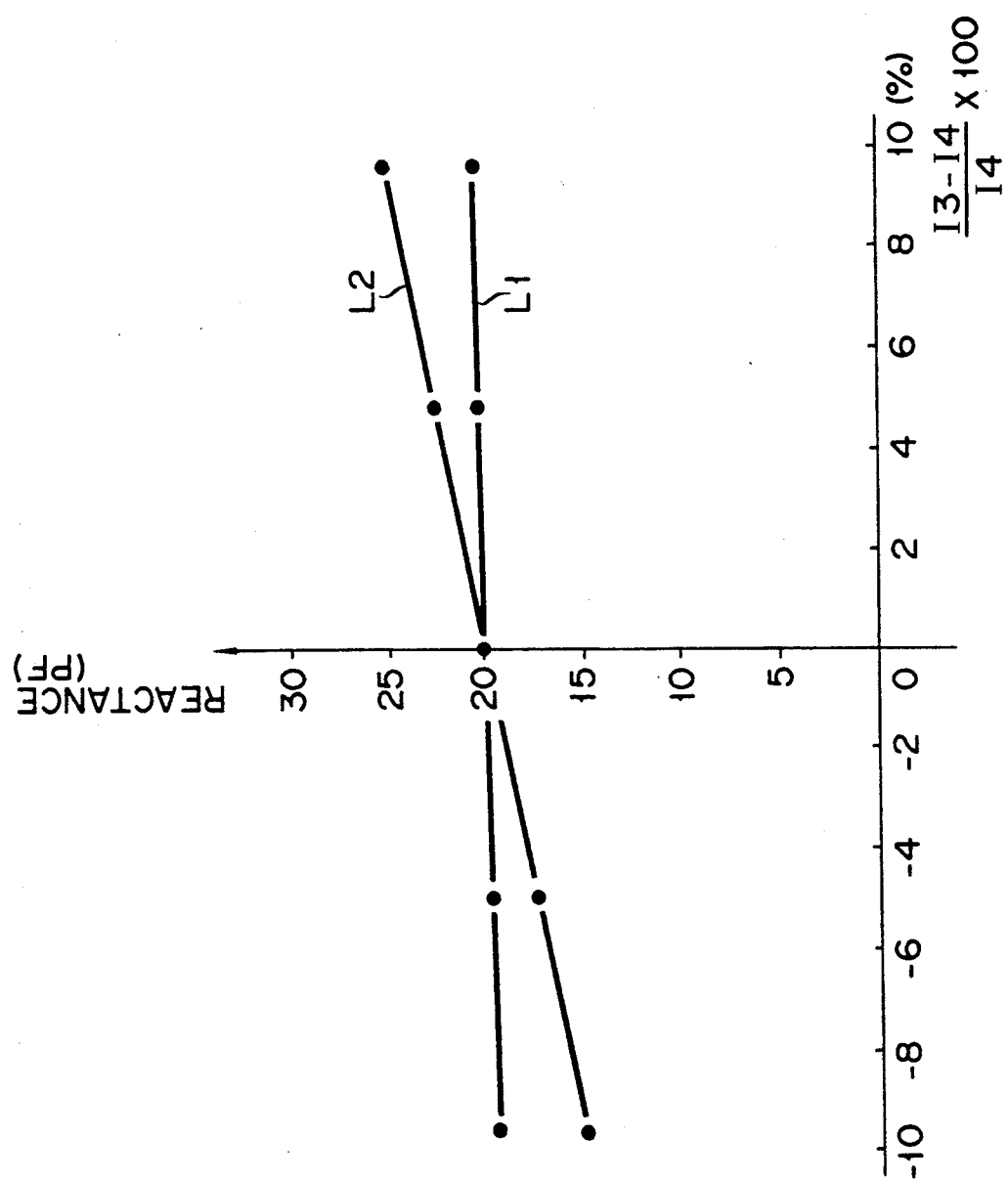
FIG. 3 is a graph showing an operating characteristic of the reactance control circuit of FIG. 2.

FIG. 3 shows a graphical representation of a relationship of the reactance C of the variable reactance circuit 14 vs. difference factor (as given by $$\frac{I3 - I4}{I4}$$

of the currents I3 and I4. In the figure, a line L1 indicates the relationship of the circuit of FIG. 2, and a line L2, that of the prior circuit of FIG. 1. To plot the graph, in the circuit of FIG. 2, C1=20 pF, R5=2.7 K ohms, I1=I2=100 uA, and R11=R12=600 ohms. As seen from the graph, in the FIG. 2 circuit according to the invention, the reactance C of the reactance circuit 14 is kept at an almost constant value (here, 20 pF) irrespective of the difference factor. The reason for this is that when I1=I2, the output currents I1 and I2 of the DC amplifier 20 are both controlled to be very small.

The description that follows is an operation of the DC amplifier 20 when the current I1 is not equal to that of the current I2.

In the description, it is assumed that I1=I+ΔI and I2=I−ΔI. Under this condition, since the base potentials of the transistors Q3 and Q4 are equal to each other, the collector current of the transistor Q3 flowing through the resistor R11 is equal to that of the transistor Q4 flowing through the resistor R12. Specifically, of the current I+ΔI flowing from the differential amplifier 12 into the node A, the current component ΔI flows into the node B through the resistors R1 and R2, and the current component I flows through the resistor R11 as the collector current of the transistor Q3. Accordingly, the current ΔI from the node A and the current I−ΔI from the differential amplifier 12 flow into the node B. Therefore, the current value flowing into the resistor R12 in the form of the collector current of the transistor Q4 is equal to I (=I−ΔI+ΔI). As a result, the collector current of the transistor Q3 flowing through the resistor R11 is equal to that of the transistor Q4 flowing through the resistor R12.

The current ΔI flows from the node A to the node B through the resistors R1 and R2, to produce a potential difference (R1+R2)×ΔI between the nodes A and B. The voltage generated across each of the resistors R11 and R12 is RI. Therefore, a potential difference (R1+R2)×ΔI is caused between the bases of the transistors Q1 and Q2. Thus, when I1≠I2, the DC amplifier 20 amplifiers the currents I1 and I2, and produces the currents I3 and I4.

As seen from the foregoing description, in the DC amplifier 20, when I1=I2, the values of the currents I3 and I4 is controlled to be small. When I1≠I2, the potential difference (R1+R2)×ΔI is caused between the bases of the transistors Q1 and Q2 and therefore the satisfactorily large currents I3 and I4 are produced.

Figure 4:
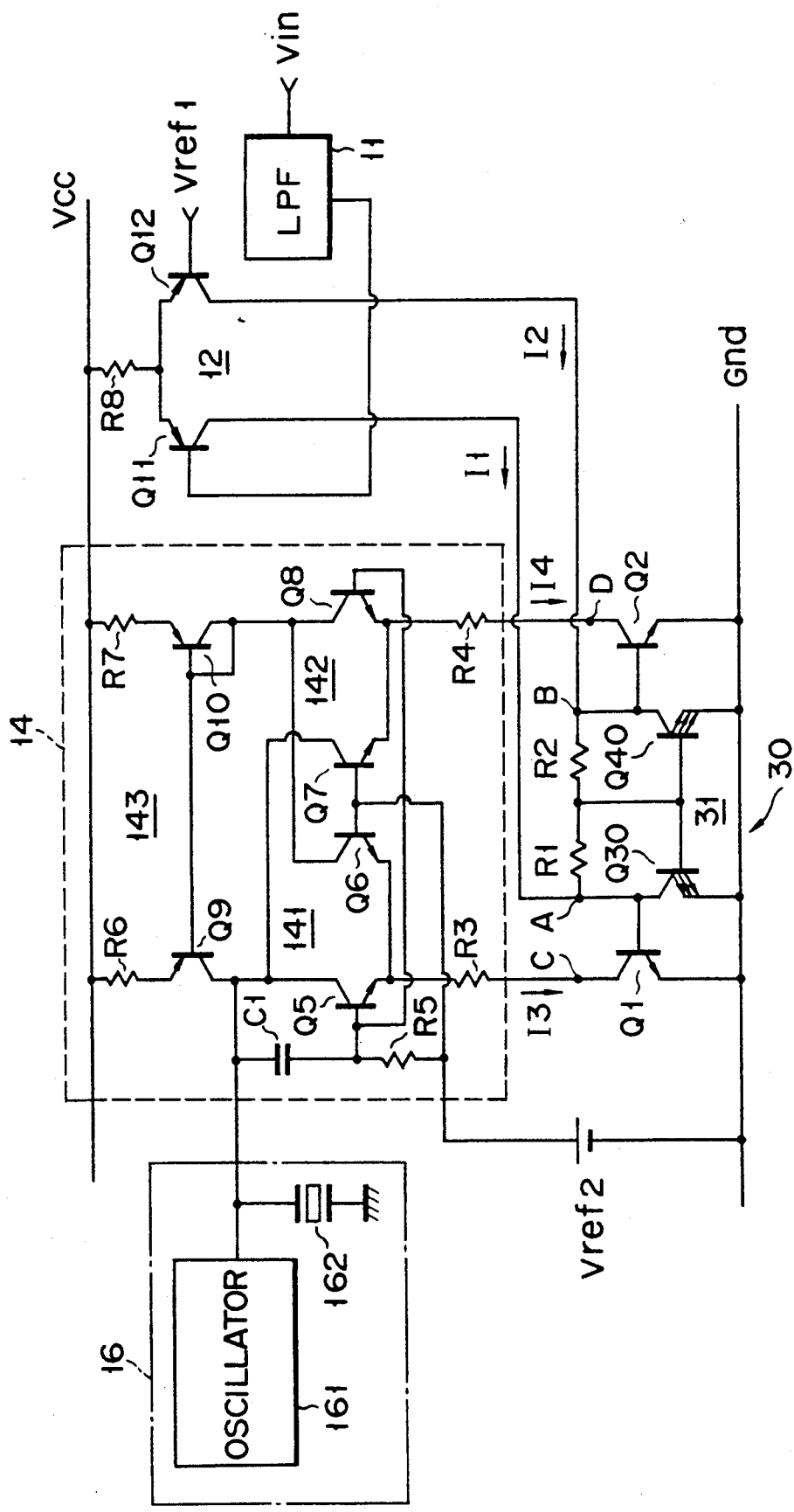
FIG. 4 is a circuit diagram showing a variable frequency oscillator using a reactance control circuit which is a second embodiment of the present invention.

FIG. 4 is a circuit diagram showing a variable frequency oscillator using a reactance control circuit, which is a second embodiment of the present invention. In this embodiment, a DC amplifier 30 is used in place of the DC amplifier 20 in the first embodiment of FIG. 2. The DC amplifier 30 is made up of NPN transistors Q1 and Q2, and a control circuit 31 for controlling the base potentials of those transistors. The control circuit 31 is made up of resistors R1 and R2, and NPN transistors Q30 and Q40. An emitter area of each of the NPN transistors Q30 and Q40 is larger than that of each of the NPN transistors Q1 and Q2. In this instance, the former is three times as large as the latter.

In the DC amplifier 30, when the currents I1 and I2 derived from the differential amplifier 12 are equal to each other, I1=I2, a potential at the node A is approximately equal to that at the node B. Accordingly, little current flows between the nodes A and B through the resistors R1 and R2. Under this condition, the potential at the common base connection of transistors Q30 and Q40 may be considered to be equal to the potential at the node A(=node B). The base potential of each of the transistors Q1 and Q2 is likewise equal to the potential at the node A(=node B). Accordingly, the base-emitter voltage VBE1 of each of the transistors Q1 and Q2 is equal to that VBE2 of each of the transistors Q30 and Q40. Since the emitter area of each transistor Q1 and Q2 is ⅓ as large as that of each transistor Q30 and Q40, the current flowing into each transistor Q1 and Q2 is ⅓ that flowing into each transistor Q30 and Q40. When the currents I1 and I2 derived from the differential amplifier 12 are equal to each other, the output currents I3 and I4 of the DC amplifier 30 are both controlled to be small.

When I1≠I2, for example, I1=I+ΔI and I2=I−ΔI, the current ΔI flows from the node A to the node B through the resistors R1 and R2. Therefore, a potential difference (R1+R2)×ΔI is caused between the nodes A and B. When the currents I1≠I2, the DC amplifier 30 amplifiers the currents I1 and I2 and produces currents I3 and I4.

Also in the DC amplifier 30, when I1=I2, the values of the currents I3 and I4 is controlled to be small. When I1≠I2, the potential difference (R1+R2)×ΔI is caused between the bases of the transistors Q1 and Q2 and therefore the satisfactorily large currents I3 and I4 are produced.

As described above, in the DC amplifier 20 or 30, when I1=I2, the currents flowing to the transistors Q1 and Q2 may be reduced. Therefore, when I1=I2, the currents flowing into the differential transistor circuits 141 and 142 in the variable reactance circuit 14 are both small. Therefore, if the transistors Q1 and Q2 are different in geometrics and operating characteristics, a difference between the current flowing to the differential transistor circuit 141 and the current flowing to the differential transistor circuit 142 is very small. For this reason, the reference reactance Cref of the variable reactance circuit 14 is free from the difference of the geometrics and the operating characteristics of the transistors Q1 and Q2. Therefore, a desired reference reactance Cref may be secured.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A reactance control circuit comprising:
   a variable reactance circuit having first and second differential transistor circuits, a reactance of said variable reactance circuit being determined by currents flowing in said first and second differential transistor circuits;
   a differential amplifier for producing first and second currents in accordance with an input voltage; and
   a DC amplifier circuit for amplifying the first and second currents derived from said differential amplifier, and for supplying the amplified currents to said variable reactance circuit to control the currents flowing in said first and second differential transistor circuits;
   said DC amplifier circuit including
   first and second input terminals for receiving said first and second currents output from said differential amplifier,
   first and second output terminals for supplying third and fourth currents, the third and fourth currents being the amplified currents supplied to said variable reactance circuit,
   a first transistor having a collector coupled to said first output terminal, an emitter coupled to a predetermined potential supplying terminal and a base,
   a second transistor having a collector coupled to said second output terminal, an emitter coupled to said predetermined potential supplying terminal and a base, and
   base potential control means for, when said first and second currents differ from each other, supplying different potentials to the bases of said first and second transistors so that the third and fourth currents flow through said first and second transistors, respectively, and,
   when the first and second currents are equal to each other, supplying a predetermined low potential to the bases of the first and second transistors so that the third and fourth currents flowing through the first and second transistors are both reduced.

2. The reactance control circuit according to claim 1, wherein said base potential control means includes a third transistor having a collector coupled to the base of said first transistor, an emitter coupled to said predetermined potential supplying terminal, and a base; a fourth transistor having a collector coupled to the base of said second transistor, an emitter coupled to said predetermined potential supplying terminal, and a base coupled to the base of said third transistor; a first impedance element coupled between said first input terminal and the bases of said third and fourth transistors; a second impedance element coupled between said second input terminal and the bases of said third and fourth transistors; a third impedance element coupled between said first input terminal and the base of said first transistor; and a fourth impedance element coupled between said second input terminal and the base of said second transistor.

3. The reactance control circuit according to claim 2, wherein the resistive components of said first and second impedance elements are substantially equal.

4. The reactance control circuit according to claim 2, wherein the resistive components of said third and fourth impedance elements are substantially equal.

5. The reactance control circuit according to claim 2, wherein said first, second, third and fourth transistors have equal geometrics.

6. The reactance control circuit according to claim 1, wherein said base potential control means includes a third transistor having a collector coupled to the base of said first transistor, an emitter having an area N times larger than an emitter area of said first transistor and coupled to said predetermined potential supply terminal, and a base; a fourth transistor having a collector coupled to the base of second transistor, an emitter having an area N times larger than an emitter area of said second transistor and coupled to said predetermined potential supply terminal, and a base coupled to the base of said third transistor; a first impedance element, coupled between said first input terminal and the bases of said third and fourth transistors; and a second impedance element, coupled between said second input terminal and the bases of said third and fourth transistors.

7. The reactance control circuit according to claim 6, wherein the resistive components of said first and second impedance elements are substantially equal.

8. The reactance control circuit according to claim 6, wherein said first and second transistors have equal geometries.

9. The reactance control circuit according to claim 1, wherein said base potential control means includes a third transistor having a collector coupled to the base of said first transistor, an emitter coupled to said predetermined potential supply terminal, and a base, the current flowing in the third transistor being N times the current flowing in the first transistor; a fourth transistor having a collector coupled to the base of said second transistor, an emitter coupled to said predetermined potential supply terminal, and a base coupled to the base of said third transistor, the current flowing in the fourth transistor being N times the current flowing in the second transistor; a first impedance element, coupled between said first input terminal and the bases of said third and fourth transistors; and a second impedance element, coupled between said second input terminal and the bases of said third and fourth transistors.

10. The reactance control circuit according to claim 2, wherein said first, second, third and fourth transistors have equal geometries and operating characteristics.

11. A reactance control circuit for a variable frequency oscillator comprising current generating means for generating first and second currents and a variable reactance circuit having a reactance which varies relative to a predetermined reactance in response to a current differential of third and fourth currents so as to vary a frequency of an output signal of said variable frequency oscillator relative to a predetermined frequency, said reactance control circuit comprising an amplifier circuit coupled to said current generating means and said variable reactance circuit for amplifying the first and second currents to the third and fourth currents and minimizing means for varying the current differential of the third and fourth currents to a predetermined relationship when the first current is substantially equal to the second current so that the frequency of the output signal of said variable frequency oscillator is substantially equal to the predetermined frequency when the first current is substantially equal to the second current.

12. The reactance control circuit for a variable frequency oscillator according to claim 11, wherein the predetermined relationship between the third and fourth currents is when the current differential of the third and fourth currently is minimized.

13. A variable frequency oscillator for generating an output signal, comprising:
a current generating circuit for generating first and second currents;
a variable reactance circuit having a reactance which varies relative to a predetermined reactance in response to a current differential of third and fourth currents so as to vary a frequency of the output signal relative to a predetermined frequency;
an oscillator means responsive to the variable reactance circuit for producing an output signal whose frequency is determined by the reactance of said variable reactance circuit, and;
a reactance control circuit for controlling the reactance of said variable reactance circuit, said reactance control circuit including amplifying means for amplifying the first and second currents to the third and fourth currents and minimizing means for substantially minimizing the current differential of the third and fourth currents when the first current is substantially equal to the second current so that the reactance of said variable reactance circuit is substantially equal to the predetermined reactance and the frequency of the output signal is substantially equal to the predetermined frequency.

14. The variable frequency oscillator according to claim 13 wherein said variable reactance circuit includes first and second differential transistor circuits which respectively receive the third and fourth currents.

15. The variable frequency oscillator according to claim 14 wherein said amplifying means comprises first and second transistors each having a base, a collector and an emitter and said minimizing means comprises a control circuit for controlling base potentials of said first and second transistors.

16. The variable frequency oscillator according to claim 15 wherein said first and second transistors comprise NPN transistors, the collectors of said first and second transistors being respectively coupled to said first and second differential transistor circuits.

17. The variable frequency oscillator according to claim 16 wherein said control circuit comprises first and second nodes for respectively receiving said first and second currents, first and second resistors coupled between said first and second nodes, a third resistor and a third transistor having a collector-to-emitter path coupled between said first node and ground potential, a fourth resistor and a fourth transistor having a collector-to-emitter path coupled between said second node and ground potential, the base of said first transistor coupled to a point between said third resistor and the collector of said third transistor, the base of said second transistor coupled to a point between said fourth resistor and the collector of said fourth transistor, and the bases of said third and fourth transistors being coupled to a point between said first and second resistors.

18. The variable frequency oscillator according to claim 13 wherein said current generating circuit comprises a different amplifier.

* * * * *